United States Patent
Karpov et al.

(10) Patent No.: US 12,500,162 B2
(45) Date of Patent: Dec. 16, 2025

(54) STAGGERED VERTICALLY SPACED INTEGRATED CIRCUIT LINE METALLIZATION WITH DIFFERENTIAL VIAS AND METAL-SELECTIVE DEPOSITION

(71) Applicant: Intel Corporation, Santa Clara, CA (US)

(72) Inventors: Elijah Karpov, Portland, OR (US); Miriam Reshotko, Portland, OR (US); Scott B. Clendenning, Portland, OR (US); Jiun-Ruey Chen, Hillsboro, OR (US); Matthew Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 17/560,085

(22) Filed: Dec. 22, 2021

(65) Prior Publication Data
US 2023/0197602 A1  Jun. 22, 2023

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76816* (2013.01); *H01L 21/76879* (2013.01);
(Continued)

(58) Field of Classification Search
CPC ........... H01L 23/5226; H01L 21/76816; H01L 21/76879; H01L 23/528
See application file for complete search history.

(56) References Cited

U.S. PATENT DOCUMENTS 9,054,164 B1 * 6/2015 Jezewski ............. H01L 23/5226
9,330,974 B2 * 5/2016 Kim ....................... H01L 23/485
(Continued)

FOREIGN PATENT DOCUMENTS

CN  107968069 A  *  4/2018  .......... H01L 23/485
CN  108040499 A  *  5/2018  ....... H01L 21/02282
(Continued)

OTHER PUBLICATIONS

Extended European Search Report from Patent Application No. 2214360.4 notified May 30, 2023, 7 pgs.
(Continued)

*Primary Examiner* — Laura M Menz
(74) *Attorney, Agent, or Firm* — Essential Patents Group, LLP

(57) ABSTRACT

Adjacent interconnect lines are in staggered, vertically spaced positions, which accordingly reduces their capacitive coupling within one level of interconnect metallization. Short and tall interconnect via openings are landed on the vertically staggered interconnect lines. Cap material selectively deposited upon upper ones of the staggered interconnect lines limits over etch of the short vias while the tall vias are advanced toward lower ones of the staggered interconnect lines. The via openings of differing depth may be filled, for example with a single damascene metallization process that defines a co-planar top surface for all via metallization over the staggered, vertically spaced interconnect lines.

12 Claims, 8 Drawing Sheets

(51) Int. Cl.
*H01L 23/528* (2006.01)
*H01L 23/532* (2006.01)

(52) U.S. Cl.
CPC ........ *H01L 23/5222* (2013.01); *H01L 23/528* (2013.01); *H01L 23/53238* (2013.01); *H01L 23/53266* (2013.01); *H01L 23/5329* (2013.01)

(56) References Cited

U.S. PATENT DOCUMENTS

| | | | | |
|---|---|---|---|---|
| 9,385,082 | B2* | 7/2016 | Jezewski | H01L 21/76897 |
| 9,805,972 | B1* | 10/2017 | Zhang | H01L 21/288 |
| 9,911,694 | B2* | 3/2018 | Jezewski | H01L 21/76816 |
| 10,026,687 | B1* | 7/2018 | Lin | H01L 23/53295 |
| 10,366,950 | B2* | 7/2019 | Lin | H01L 23/53209 |
| 11,004,790 | B2* | 5/2021 | Briggs | H01L 21/76877 |
| 11,380,617 | B2* | 7/2022 | Jezewski | H01L 23/5226 |
| 11,444,024 | B2* | 9/2022 | Lin | H01L 23/5226 |
| 11,538,749 | B2* | 12/2022 | Lee | H01L 21/76816 |
| 12,027,458 | B2* | 7/2024 | Lin | H01L 21/76841 |
| 12,211,786 | B2* | 1/2025 | Wei | H01L 21/76879 |
| 2014/0024146 | A1* | 1/2014 | Anzola | H01L 23/585 |
| | | | | 257/E21.531 |
| 2015/0179515 | A1* | 6/2015 | Jezewski | H01L 21/76802 |
| | | | | 257/774 |
| 2015/0243599 | A1* | 8/2015 | Jezewski | H01L 23/5329 |
| | | | | 438/618 |
| 2015/0294933 | A1* | 10/2015 | We | H01L 23/5283 |
| | | | | 438/624 |
| 2016/0315046 | A1* | 10/2016 | Jezewski | H01L 23/5226 |
| 2017/0263553 | A1* | 9/2017 | Schenker | H01L 21/76808 |
| 2017/0278796 | A1* | 9/2017 | Briggs | H01L 21/76831 |
| 2017/0330761 | A1* | 11/2017 | Chawla | H01L 23/53295 |
| 2018/0076133 | A1* | 3/2018 | Bonilla | H01L 21/76877 |
| 2018/0182702 | A1* | 6/2018 | Jezewski | H01L 21/76816 |
| 2018/0204797 | A1* | 7/2018 | Lin | H01L 21/02282 |
| 2019/0244806 | A1* | 8/2019 | Bristol | H01L 21/76849 |
| 2020/0098619 | A1* | 3/2020 | Marieb | C23C 18/48 |
| 2020/0388565 | A1* | 12/2020 | Lin | H01L 23/5222 |
| 2020/0411427 | A1* | 12/2020 | Lin | H01L 23/528 |
| 2021/0118693 | A1* | 4/2021 | Joy | H01L 23/535 |
| 2021/0296169 | A1* | 9/2021 | Philip | H01L 21/76816 |
| 2021/0407895 | A1* | 12/2021 | Lin | H01L 21/76879 |
| 2022/0139823 | A1* | 5/2022 | Lin | H01L 21/76841 |
| | | | | 257/774 |
| 2022/0157711 | A1* | 5/2022 | Lee | H01L 21/76834 |
| 2022/0199516 | A1* | 6/2022 | Chebiam | H01L 23/528 |
| 2022/0270964 | A1* | 8/2022 | Jezewski | H01L 21/76802 |
| 2022/0352068 | A1* | 11/2022 | Lin | H01L 21/7682 |
| 2022/0359385 | A1* | 11/2022 | Lee | H01L 21/76897 |
| 2022/0415818 | A1* | 12/2022 | Naylor | H01L 21/76883 |
| 2023/0065583 | A1* | 3/2023 | Lo | H01L 21/76885 |
| 2023/0197602 | A1* | 6/2023 | Karpov | H01L 23/5329 |
| | | | | 257/758 |
| 2023/0395506 | A1* | 12/2023 | Reshotko | H01L 21/76843 |
| 2023/0402369 | A1* | 12/2023 | Chang | G11C 17/16 |
| 2024/0038314 | A1* | 2/2024 | Chang | H01L 23/5256 |
| 2024/0105598 | A1* | 3/2024 | Guler | H01L 23/53238 |
| 2024/0222270 | A1* | 7/2024 | Chang | H01L 23/5256 |
| 2024/0304543 | A1* | 9/2024 | Lin | H01L 21/76819 |

FOREIGN PATENT DOCUMENTS

| | | | | | |
|---|---|---|---|---|---|
| CN | 110993583 | A | * | 4/2020 | H01L 23/53242 |
| CN | 108040499 | B | * | 12/2021 | H01L 21/02282 |
| CN | 114512455 | A | * | 5/2022 | H01L 21/76877 |
| CN | 114649297 | A | * | 6/2022 | H01L 23/53238 |
| CN | 115527991 | A | * | 12/2022 | H01L 21/76849 |
| CN | 116171493 | A | * | 5/2023 | H01L 21/76897 |
| CN | 116344499 | A | * | 6/2023 | H01L 23/5329 |
| DE | 102018127143 | A1 | * | 6/2019 | H01L 23/53209 |
| DE | 102018127148 | A1 | * | 6/2019 | H01L 21/76224 |
| DE | 102021126158 | A1 | * | 5/2022 | H01L 21/7682 |
| EP | 3968364 | | | 3/2022 | |
| EP | 4016600 | A1 | * | 6/2022 | H01L 21/76871 |
| EP | 4057327 | A1 | * | 9/2022 | H01L 21/76879 |
| EP | 4145498 | | | 3/2023 | |
| EP | 4191651 | A1 | * | 6/2023 | H01L 23/5226 |
| EP | 4202992 | A1 | * | 6/2023 | H01L 23/53295 |
| EP | 4290565 | A1 | * | 12/2023 | H01L 21/76816 |
| EP | 4345868 | A2 | * | 4/2024 | H01L 23/53238 |
| EP | 4345870 | A1 | * | 4/2024 | H01L 21/76883 |
| EP | 4345871 | A1 | * | 4/2024 | H01L 23/528 |
| WO | WO-2022093430 | A1 | * | 5/2022 | H01L 21/76841 |

OTHER PUBLICATIONS

Non-Published, U.S. Appl. No. 16/911,879, filed Jun. 25, 2020, 4 pgs.
Non-Published, U.S. Appl. No. 17/017,735, filed Sep. 11, 2020.
Non-Published, U.S. Appl. No. 17/031,825, filed Sep. 24, 2020.

* cited by examiner

STAGGERED VERTICALLY SPACED INTEGRATED CIRCUIT LINE METALLIZATION WITH DIFFERENTIAL VIAS AND METAL-SELECTIVE DEPOSITION

BACKGROUND

Demand for higher performance integrated circuits (ICs) in electronic device applications has motivated increasingly dense transistor architectures. Interconnect parasitics become a greater challenge as the density of interconnect metallization structures keeps pace with transistor density. For example, the resistance-capacitance (RC) delay associated with interconnects of an IC increase with the density of the interconnects.

Interconnect structures, and techniques of fabricating such structures, that reduce capacitive coupling between nearest interconnect lines without reducing the lateral line pitch associated with a particular IC technology node would therefore be commercially advantageous over alternative techniques and structures.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
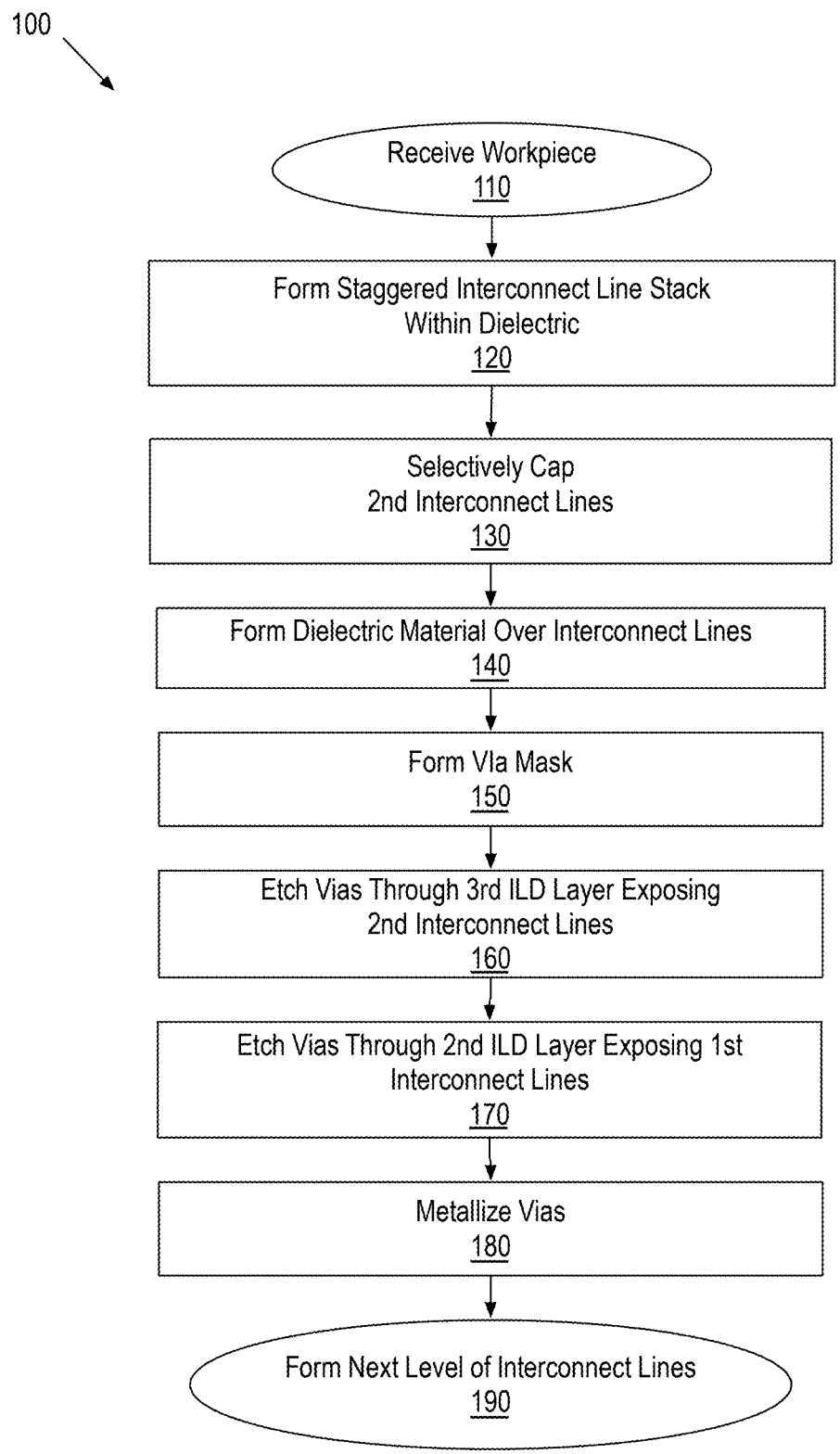
FIG. 1 is a flow diagram illustrating methods of fabricating an IC having vertically spaced and laterally staggered line metallization with differential vias, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

Described below are examples of integrated circuit interconnect structures in which adjacent parallel metallization lines are in vertically spaced positions, which accordingly reduces their capacitive coupling. In contrast to metallization lines of two different metallization levels, which have their longest lengths in substantially orthogonal directions, the staggered interconnect lines described herein have their lengths extending in parallel directions. In other words, the staggered lines run parallel to each other. As such, the staggered interconnect lines are akin to interconnect lines of a single interconnect metallization level, however nearest lines are not within the same horizontal plane or the same vertical plane, but rather are offset, or staggered, from one another. The physical distance between two adjacent parallel lines of a given pitch is therefore increased by their vertical and horizontal offset, and since two lines nearest to each other are within different vertical planes, electric field strength between them may be limited to fringing fields.

Staggered metallization lines may accordingly include within one level of interconnect metallization, for example as a means of controlling intra-layer capacitance of integrated circuit interconnects. As described further below, during fabrication of an IC structure, short and tall interconnect via openings are landed on the vertically spaced and horizontally staggered interconnect lines. These "differential" via openings of differing depth may then be filled, for example with a single damascene metallization process that defines a co-planar top surface for all via metallization over a level of staggered interconnect lines. These metallization techniques may be practiced for each successive metallization level in a back-end-of-line (BEOL) IC fabrication process to form any number of metallization levels required by a particular IC.

FIG. 1 is a flow diagram illustrating methods 100 for fabricating an IC having vertically spaced and laterally staggered line metallization with differential vias, in accordance with some embodiments. FIGS. 2-11 illustrate cross-sectional isometric views of an IC interconnect structure evolving as operations in methods 100 are practiced, in accordance with some exemplary embodiments.

Referring first to FIG. 1, methods 100 begin at input 110 where a workpiece is received. The workpiece may be any known to be suitable for a IC fabrication such as a large format (e.g., 300-450 mm) wafer. At block 120, vertically spaced and laterally staggered interconnect lines are formed within one or more dielectric material layers. Block 120 may comprise one or more lithographic patterning processes and one or more damascene-type line formation comprising metal planarization, and/or one or more subtractively patterned line formation comprising dielectric planarization. For a thorough discussion of some exemplary techniques that may be practiced at block 120 to arrive at vertically spaced and laterally staggered interconnect lines with advantageously few lithographic masking operations, the interested reader is referred to U.S. patent application Ser. Nos. 14/139,363 and 16/455,662, both under common ownership and/or obligation of assignment.

Figure 2:
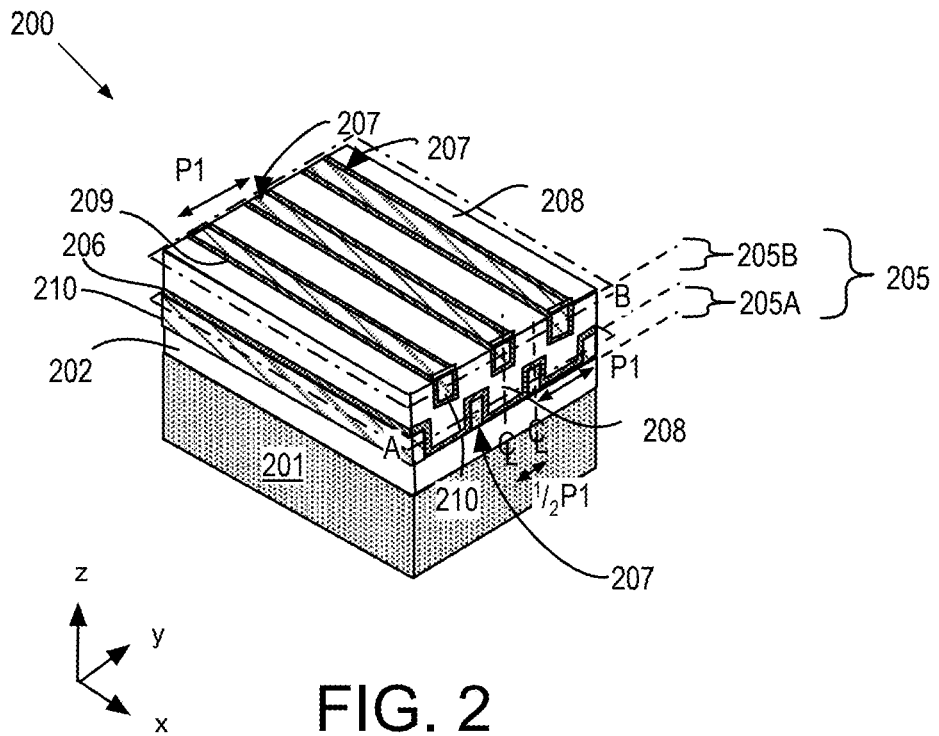
FIGS. 2, 3, 4, 5, 6, 7, 8, 9, 10, and 11 illustrate cross-sectional isometric views of an IC interconnect structure evolving as operations in the methods depicted in FIG. 1 are practiced, in accordance with some exemplary embodiments.

FIG. 2 further illustrates an exemplary IC structure portion 200 including staggered interconnect lines 205 over a substrate 201. In some embodiments, substrate 201 includes a semiconductor wafer, which may include one or more Group IV semiconductor material layers (e.g., Si, Ge, SiGe, GeSn, etc.), one or more Group III-V semiconductor material layers (e.g., InGaAs), one or more Group III-N semiconductor material layers (e.g., GaN), or a combination of such semiconductor material layers, or similar.

Substrate 201 may include one or more device layers, each including one or more of the semiconductor material layers, and may also have one or more interconnect levels comprising metallization features that electrically interconnect devices (e.g. transistors) of the device layer(s). In some examples, substrate 201 includes MOSFETs (not depicted) in a region of a monocrystalline semiconductor device layer (e.g., silicon, Ge, SiGe, GeSn, etc.). Such FETs may be part of any application specific IC (ASIC) including one or more IP cores, for example. In some embodiments, circuitry within IC structure portion 200 comprises a processor core. In other embodiments, circuitry within IC structure portion 200 comprises a wireless radio circuit or floating point gate array (FPGA).

Staggered interconnect lines 205 include an interconnect line level 205A under an interconnect line level 205B. As shown, each interconnect line level 205A and 205B comprises interconnect lines 207 embedded within a dielectric (insulator) material 208. Within interconnect line level 205A, an x-y plane A, substantially parallel to an x-y plane of substrate 201, passes through lower ones of interconnect lines 207, and does not pass through any upper ones of interconnect lines 207. Within interconnect line level 205B, another x-y plane B, substantially parallel to an x-y plane A, passes through upper ones of interconnect lines 207, and does not pass through any lower ones of interconnect lines 207. In the illustrated examples, within each interconnect line level 205A and 205B, interconnect lines 207 are substantially coplanar. However, co-planarity may not be as ideal as illustrated as a result of inherent variability in manufacturing.

Within each interconnect line level 205A and 205B, interconnect lines 207 are substantially parallel to each other, and have a pitch P1. Although pitch P1 may vary, in some examples pitch P1 is less than 50 nm. Notably, interconnect lines 207 of interconnect line level 205A are parallel to interconnect lines 207 of interconnect line level 205B, but are laterally offset, or staggered, in at least one dimension (e.g., y-axis). In the illustrated example, interconnect lines 207 of interconnect line level 205A are staggered by approximately ½ pitch P1 so that within pitch P1 there are two interconnect lines 207, one within interconnect line level 205A and another within interconnect line level 205B. In the example shown, a top surface of interconnect lines 207 is substantially planar with a top surface of dielectric material 208.

Interconnect lines 207 may comprise one or more of any conductive materials known to be suitable for IC interconnect lines. Each interconnect line 207 comprises a fill material 210. In some exemplary embodiments fill material 210 is predominantly Cu. In other embodiments fill material 210 is predominantly W. In other embodiments fill material 210 is predominantly Ru. In some embodiments, interconnect lines 207 of interconnect line levels 205A and 205B have substantially the same composition (i.e., same fill material). However, interconnect line levels 205A and 205B may also have different compositions. For example, fill material 210 of interconnect line level 205A may have a first of any of the above exemplary compositions, while fill material 210 of interconnect line level 205B may have a second of any of the above exemplary compositions.

Within staggered interconnect line levels 205A and 205B, there may be one or more dielectric materials surrounding interconnect lines 207. In the illustrated example, a conformal dielectric material 206 is over a top, and adjacent to a sidewall, of interconnect lines 207 within interconnect line level 205A. The non-conformal, planarized dielectric material 208 is over dielectric material 206. Furthermore, a conformal dielectric material 209 is under a bottom, and adjacent to a sidewall, of interconnect lines 207 within interconnect line level 205B. Dielectric materials 206 and 209, may, for example, have the same composition. However, dielectric material 206 and 209 may also be of different composition. In still other embodiments, dielectric materials 206 and 209 may be absent from a staggered line structure that is otherwise substantially as illustrated in FIG. 2.

Dielectric materials 206, 208 and 209 may each have any composition(s) suitable for electrical isolation of IC interconnect lines 207. Dielectric material 208 may advantageously have a different composition than one or both of dielectric materials 206 and 209. Dielectric material 208 within interconnect line levels 205A and 205B, may be of a substantially homogeneous composition, for example, being a single low-k dielectric material (e.g., SiOCH) having a relative permittivity below 3.5. In other examples, dielectric material 208 may be any of SiO, SiON, hydrogen silsesquioxane, methyl silsesquioxane, polyimide, polynorbornenes, benzocyclobutene, or the like.

Dielectric materials 206 and 209 may also be any low-k dielectric material (e.g., SiOCH) or any of SiO, SiON, hydrogen silsesquioxane, methyl silsesquioxane, polyimide, polynorbornenes, benzocyclobutene, or the like. Implementations dielectric materials 206 and 209 may vary with the composition of dielectric material 208. In some examples, dielectric materials 206 and 209 comprises a higher-K material, which might have more nitrogen, than dielectric material 208. Dielectric materials 206 and 209 may then function as etch stops offering some level of etch selectively relative to dielectric material 208. In other embodiments, dielectric materials 206 and 209 have an alternative composition, such as, but not limited to, $HfO_2$, $ZrO$, $Al_2O_3$, for example. Dielectric materials 206 and 209 may have any thickness, but in some advantageous embodiments have a thickness less than 10 nm, and advantageously no more than 5 nm (e.g., 2-3 nm, etc.).

As further illustrated in FIG. 2, a dielectric material 202 is between staggered interconnect lines 207 and substrate 201. One or more conductive vias (not depicted) may extend through dielectric material 202, for example to couple at least the lower level of interconnect lines 207 to features within substrate 201. Dielectric material 202 may have the same composition as dielectric material 208, or it may be different. In some examples, dielectric material 202 has one of the compositions described above as suitable for dielectric material 208.

Returning to FIG. 1, methods 100 continue at block 130, where a cap material is deposited upon an exposed surface of the interconnect lines selectively over the adjacent dielectric material surface(s). In exemplary embodiments, the cap material deposited at block 130 is conductive, and may be predominantly a metal. Such a selective deposition may, for example, be performed with an Atomic Layer Deposition (ALD) process in further reliance on heterogeneity of surface chemistry between the interconnect line material and adjacent dielectric material. For example, an area selective ALD (AS-ALD) technique may be practiced at block 130 in which a surface of the interconnect line is a growth surface while the adjacent dielectric material layer(s) is a non-growth surface. A suitable disparity in the functional groups present on the growth surface and non-growth surface can enable cap material to be directly formed on only the interconnect line material surface. Hence, through manipulation of functional surface groups, the interconnect line material layer(s) may be activated and/or the adjacent dielectric material layer(s) may be deactivated to obtain the sufficient surface heterogeneity for area selective deposition of the cap material bat block 130.

In some deactivation/blocking embodiments, a self-assembled monolayer (SAM) is employed as a means of deactivating surfaces of the dielectric material layer(s). The SAM molecules may form a blanket monolayer that blocks all but the interconnect line material surface, so that ALD of the cap material is inhibited where the SAM is present. SAM molecules for deactivating/passivating the dielectric material may comprise small or long (C1-C22) alkyl chains or fluorinated chains, and a head group that attaches preferentially to dielectric surfaces. In some embodiments, the head group comprises a silane, such as, but not limited to, an alkoxysilane, aminosilane, chlorosilane or a cyclic azasiliane. In one exemplary embodiment, the SAM is octadecyl trichlorosilane. In another exemplary embodiment, the SAM is trimethoxy(octadecyl)silane. In another exemplary embodiment, the SAM is triethoxy(3,3,4,4,5,5,6,6,7,7,8,8,9,9,10,10,10-heptadecafluorodecyl. In another exemplary embodiment, the SAM is 1-(3,3,4,4,5,5,6,6,7,7,8,8,9,9,10,10,10-heptadecafluorodecyl)-N,N,N',N',N",N"-hexamethyl-silanetriamine.

If the selectivity of SAM attachment (deactivation/passivation) is insufficient, for example due to reactivity of the SAM with both the interconnect line material surface and the adjacent dielectric material surface, a thermal annealing (e.g., under 400° C. for 30 min), and/or a wet chemical clean/etch (e.g., 50:1 HF:H2O) may be performed following the SAM treatment to remove any SAM passivation that reacted on surfaces of the interconnect line material layer(s) while the more resilient SAM passivation that reacted on surfaces of the dielectric material layer(s) is retained. Following the deposition of the cap material, the SAM may be removed, for example by a thermal treatment of sufficient temperature (e.g., above about 400° C.), or by any wet clean/etch suitable for a particular SAM chemistry.

Figure 3:
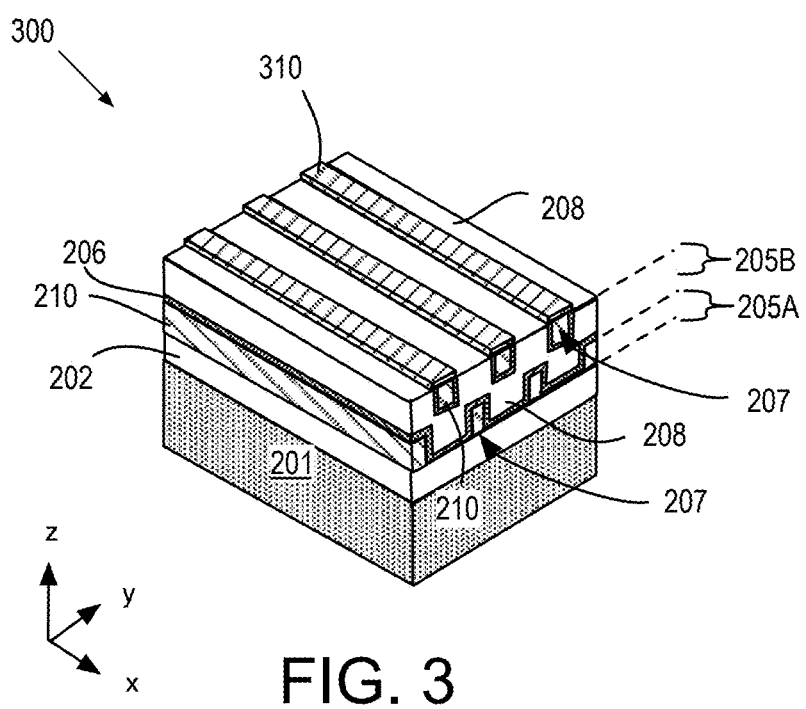

In the example illustrated in FIG. 3, IC structure portion 300 comprises IC structure portion 200 (FIG. 2) after a cap material 310 has been selectively deposited on interconnect lines 207 within interconnect line level 205B. The composition of the cap material 310 may vary with implementation, but is advantageously different than the composition of the interconnect lines 207. For example, where interconnect lines 207 comprise predominantly Cu (e.g., fill metal), cap material 310 is advantageously predominantly one of Co, Mo, W, Ni, Pd or Ir as these metals are compatible with AS-ALD upon Cu. In other embodiments where interconnect lines 207 predominantly W, cap material 310 is advantageously predominantly one of Ru, Co, Mo, Ni, Pd, or Ir, which are again compatible with AS-ALD upon W. In other embodiments where interconnect lines 207 are predominantly Ru, cap material 310 is advantageously predominantly one of W or Mo.

Returning to FIG. 1, methods 100 continue at block 140 where one or more dielectric material layers are deposited over the staggered interconnect lines. The dielectric material(s) deposited at block 140 may be of any composition(s) suitable as interlayer dielectric (ILD) for an IC. Any deposition technique(s) suitable for the dielectric composition may be practiced at block 140.

Figure 4:
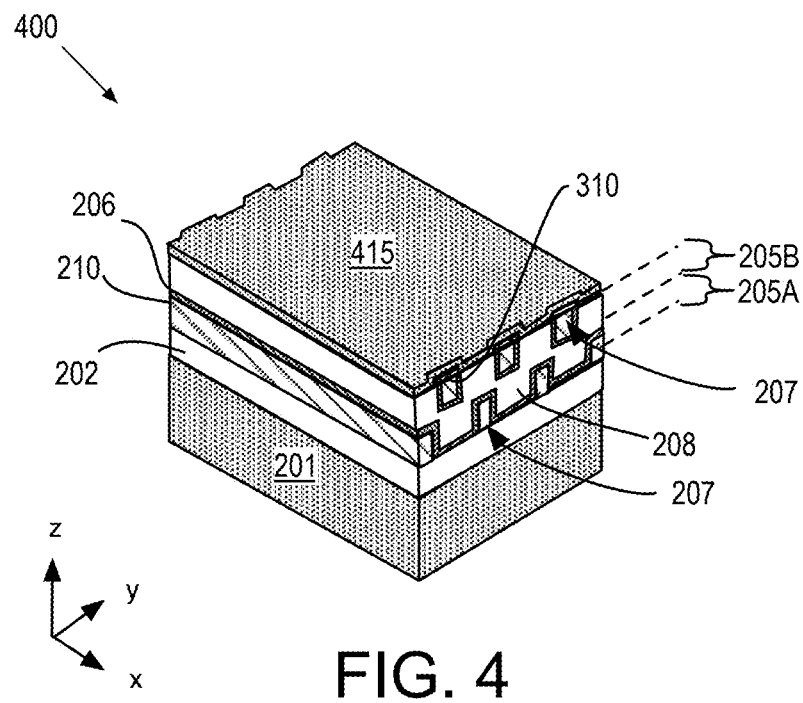
Figure 5:
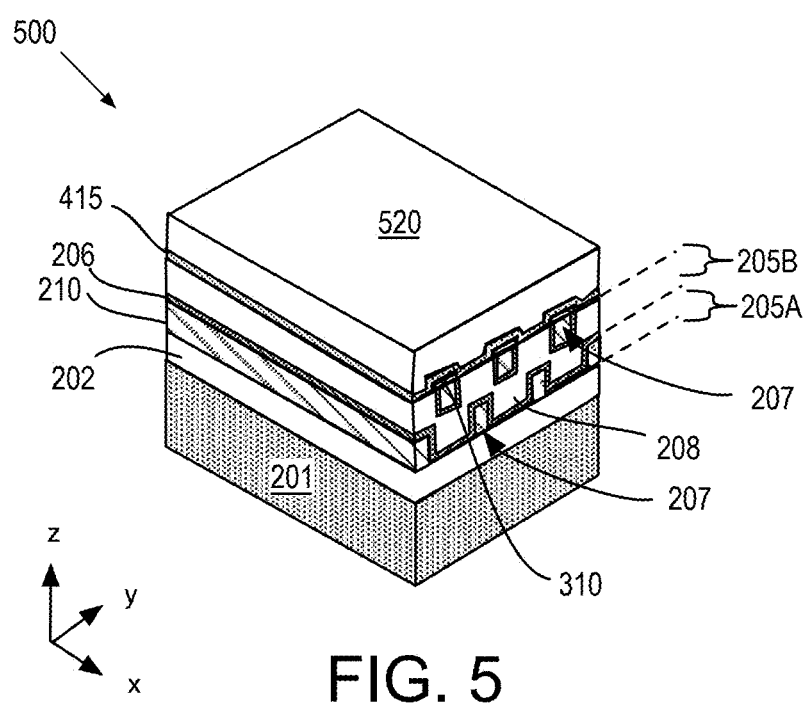
Figure 6:
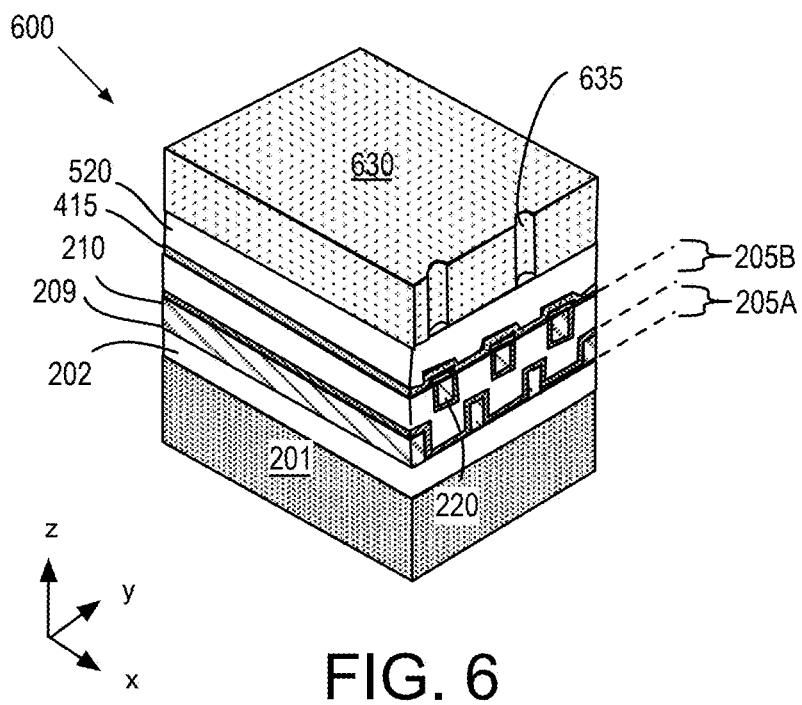

In the example further illustrated in FIG. 4, an IC structure portion 400 comprises IC structure portion 300 (FIG. 3) after a first dielectric material 415 has been blanket deposited over cap material 310, for example by CVD. FIG. 5 further illustrates an IC structure portion 500 comprising IC structure portion 400 (FIG. 4) after a second dielectric material 520 has been blanket deposited over the first dielectric material 415, for example by CVD. Thickness dielectric materials 415 and 520 may each vary with implementation. Dielectric material 520 may again be any dielectric material suitable for electrical isolation of integrated circuitry such as, but not limited to, SiN, SiO, SiON, SiOC, hydrogen silsesquioxane, methyl silsesquioxane, polyimide, polynorbornenes, benzocyclobutene, or the like.

In the illustrated embodiment, dielectric material 520 has a different composition than dielectric material 415. For example, dielectric material 415 may comprise more nitrogen than dielectric material 520, and/or dielectric material 520 comprises more oxygen than dielectric material 415. In some specific embodiments, dielectric material 415 is SiN, while dielectric material 520 is $SiO(H)C_x$. For some embodiments, dielectric material 415 may have substantially the same composition as dielectric material 206 and may therefore similarly function as an etch stop layer where dielectric material 520 has a composition substantially the same as (or at least more similar to) dielectric material 208.

Returning to FIG. 1, methods 100 continue at block 150 where a via mask is formed. At block 150, any mask material (e.g., a photosensitive material) may first be patterned with via mask openings 635. In the example further illustrated in FIG. 6, an IC structure portion 600 comprises IC structure portion 500 (FIG. 5) after a via mask 630 has been formed and patterned with via mask openings 635.

Methods 100 (FIG. 1) continue at block 150 where the mask pattern is then translated by an etch of the underlying dielectric materials, thereby forming shallow vias at block 160 and deeper vias at block 170. The dielectric material etch may proceed unimpeded where via openings coincide with various dielectric materials. However, the dielectric material etch is impeded where via openings coincide with the selectively deposited cap material. Hence, the cap material deposited at block 130 may improve the over etch margin sufficiently to enable the formation of differential via openings to multiple levels of staggered interconnect lines. The etches performed at blocks 160 and 170 will therefore reach different depths according to the interconnect line cap pattern without exposing fill material of the upper level of interconnect lines to excessive overetch during block 170. Any single-step or multi-step anisotropic reactive ion etch (RIE) process (e.g., based on a $C_xF_y$ plasma chemistry) may be practiced at blocks 160 and 170, as embodiments are not limited in this respect.

Figure 7:
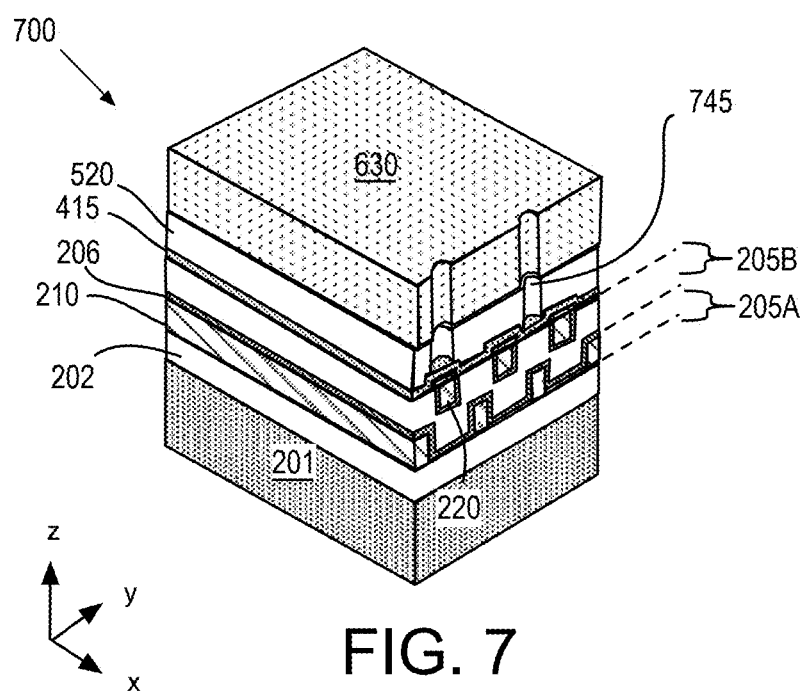
Figure 8:
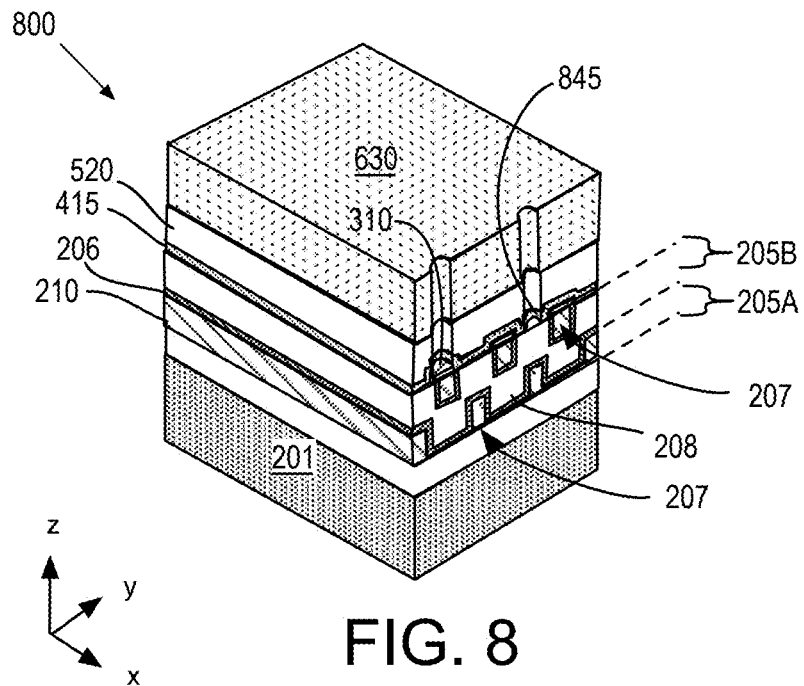

In the example further illustrated in FIG. 7, an IC structure portion 700 comprises IC structure portion 600 (FIG. 6) after a first dielectric etch is performed to form via openings 745 through dielectric material 520. In this example, the dielectric etch process has stopped on dielectric material 415. FIG. 8 further illustrates an IC structure portion 700 comprising IC structure portion 700 (FIG. 7) after another dielectric etch process is performed to advance via openings 845 through dielectric material 415, exposing cap material 310 or dielectric material 208, depending on the overlay of the vias relative to the various underlying interconnect lines 207.

Figure 9:
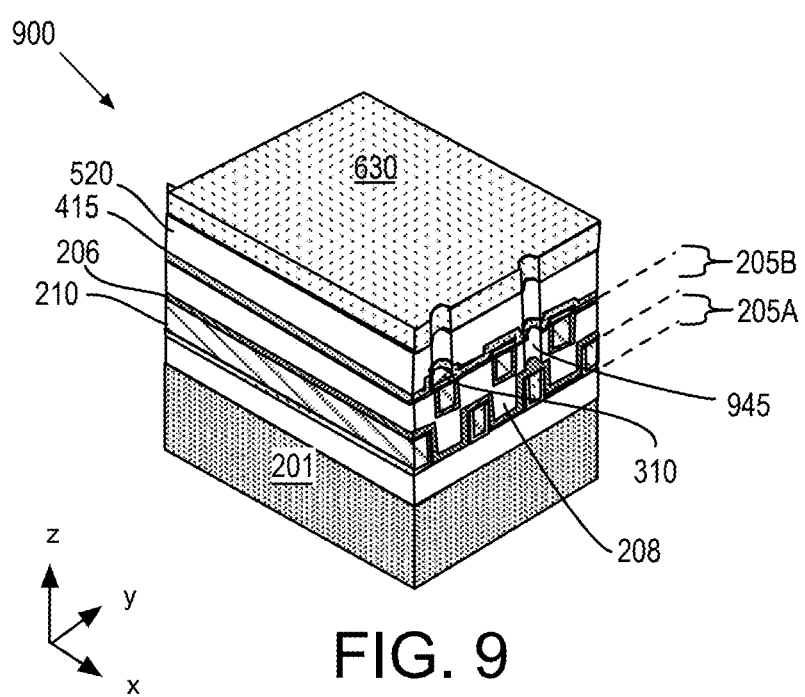
Figure 10:
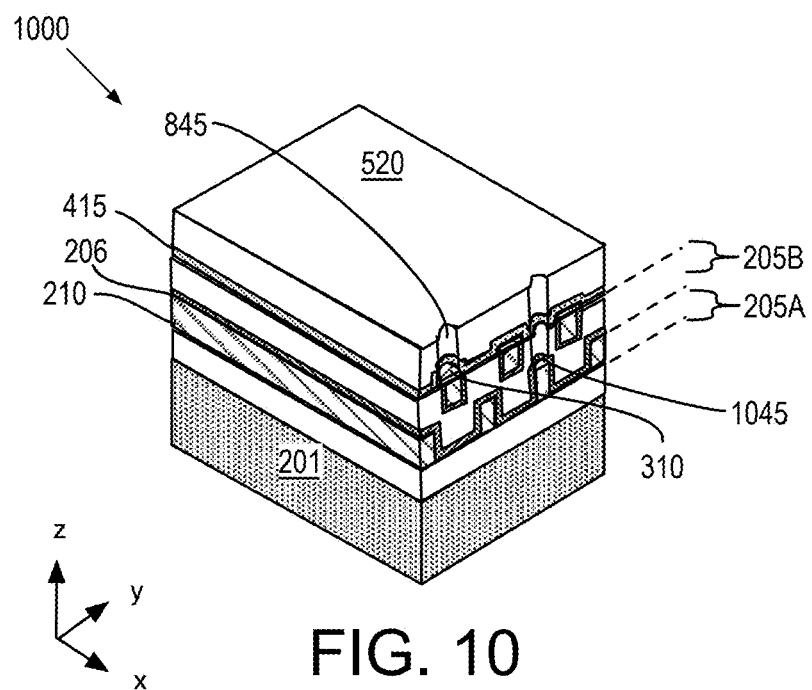

In the example further illustrated in FIG. 9, an IC structure portion 900 comprises IC structure portion 800 (FIG. 8) after another anisotropic dielectric etch is performed to advance via openings 945 partially through dielectric material 208, exposing underlying dielectric material 206. In this example, the dielectric etch process has stopped on dielectric material 206. FIG. 10 further illustrates an IC structure portion 1000 comprising IC structure portion 900 (FIG. 9) after a final dielectric etch is performed to advance via openings 1045 through dielectric material 206, exposing fill material 210 of an interconnect line 207 within interconnect line level 205A. Following the completion of differential via openings 845 and 1045, any residual via mask may be removed from dielectric material 520.

Although the shallow via openings 845 and deep via openings 1045 are depicted with substantially vertical (e.g., z-dimension) sidewalls, it is appreciated that either or both of openings 845 and 1045 may instead have less idealized profiles, for example with tapered sidewall slopes and a top diameter being slightly larger than a bottom diameter. In the example illustrated in FIG. 10, cap material 310 is never completely consumed by the via etch process. Hence, cap material 310 remains over the entirety of the top of interconnect lines 207 within interconnect line level 205B. In other embodiments where cap material 310 is at some point consumed by the dielectric via etch, cap material 310 remains over portions of the top of interconnect lines 207 within interconnect line level 205B where no via is formed. Since no cap material 310 was formed over interconnect lines 207 within interconnect line level 205A, fill material 210 is exposed at the bottom of deep via 1045.

Returning to FIG. 1, methods 100 continue at block 180 where the via openings are filled with via metallization. Any via fill process may be practiced at block 180. In some exemplary embodiments, a Cu-based single damascene process is practiced at block 180. Methods 100 then end at output 190 where any number of interconnect levels may be completed substantially as described herein, or according to any known method(s).

Figure 11:
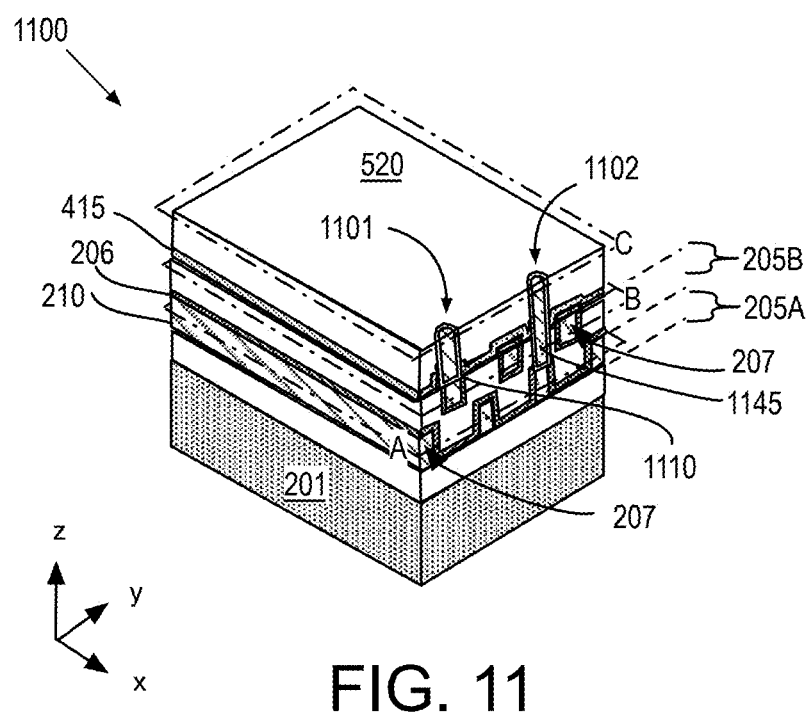

In the example further illustrated in FIG. 11, an IC structure portion 1100 comprises IC structure portion 1000 (FIG. 10) after a via metallization process substantially fills the differential vias 1101 and 1102 landing on interconnect lines 207 within each of interconnect levels 205A and 205B. A top surface of the via metallization may be planarized, for example with any CMP process. In the example illustrated, shallow via 1101 and deep via 1102 are both within a plane C (i.e., co-planar along plane C) that is over interconnect lines 207 of both interconnect lines levels 205A and 205B. Hence, all vias 1101 and 1102 may have a coplanar upper surface, but intersect interconnect lines within different planes (e.g., A and B) at different depths.

In the illustrated examples vias 1101 and 1102 include a liner 1110 and a fill material 1145. In some embodiments, fill material 1145 is predominantly Cu. Liner 1110 may be any suitable diffusion barrier, such as but not limited to Ta or $TaN_x$, for example. In other embodiments, fill material 1145 is predominantly Ru, Co, Mo, W, Ni, Pd, or Ir. Depending on the composition of fill material 1145, the composition of liner 1110 may vary or may be completely absent.

Figure 12:
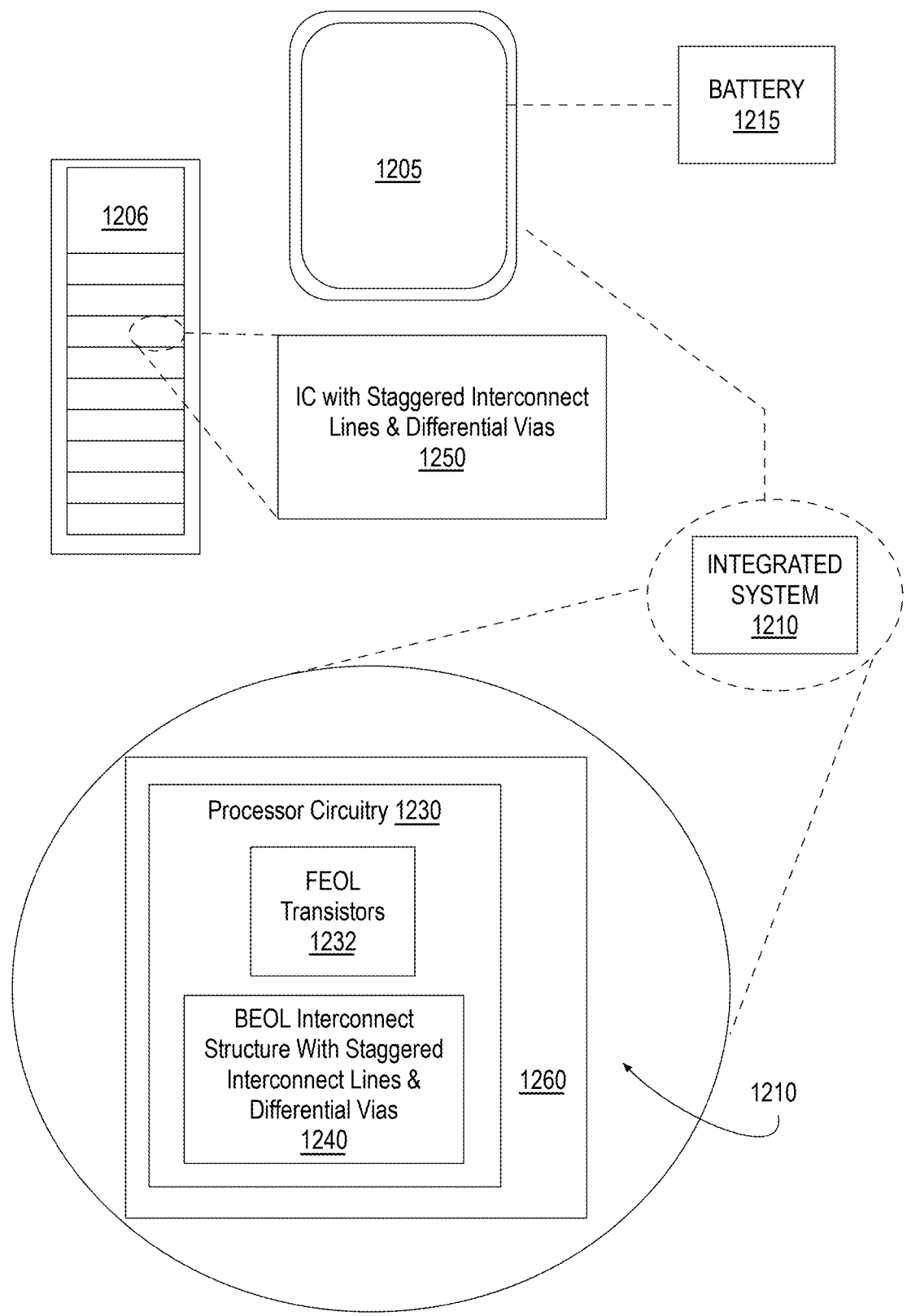
FIG. 12 illustrates a mobile computing platform and a data server machine employing an IC with embedded memory including a double-walled ferroelectric capacitor, in accordance with some embodiments.

FIG. 12 illustrates a mobile computing platform 1205 and a data server computing platform 1206 employing an IC including differential vias contacting laterally staggered interconnect lines in which only a top level of the staggered interconnect lines comprises a cap material, for example as described elsewhere herein. The server platform 1206 may be any commercial server, for example including any number of high-performance computing platforms disposed within a rack and networked together for electronic data processing, which in the exemplary embodiment includes a microprocessor 1250 including differential vias contacting laterally staggered interconnect lines in which only a top level of the staggered interconnect lines comprises a cap material, for example as described elsewhere herein.

The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), a chip-level or package-level integrated system 1210, and a battery 1215. At least one IC of chip-level or package-level integrated system 1210 includes an interconnect structure with line metallizations of different heights within a single metallization level, for example as described elsewhere herein. In the example shown in expanded view 1220, integrated system 1210 includes an SOC 1260 with microprocessor circuitry 1230 that includes FEOL transistors 1232 and BEOL interconnect structures 1240. In exemplary embodiments interconnect structures 1240 include differential vias that contact laterally staggered interconnect lines in which only a top level of the staggered interconnect lines comprises a cap material, for example as described elsewhere herein.

Figure 13:
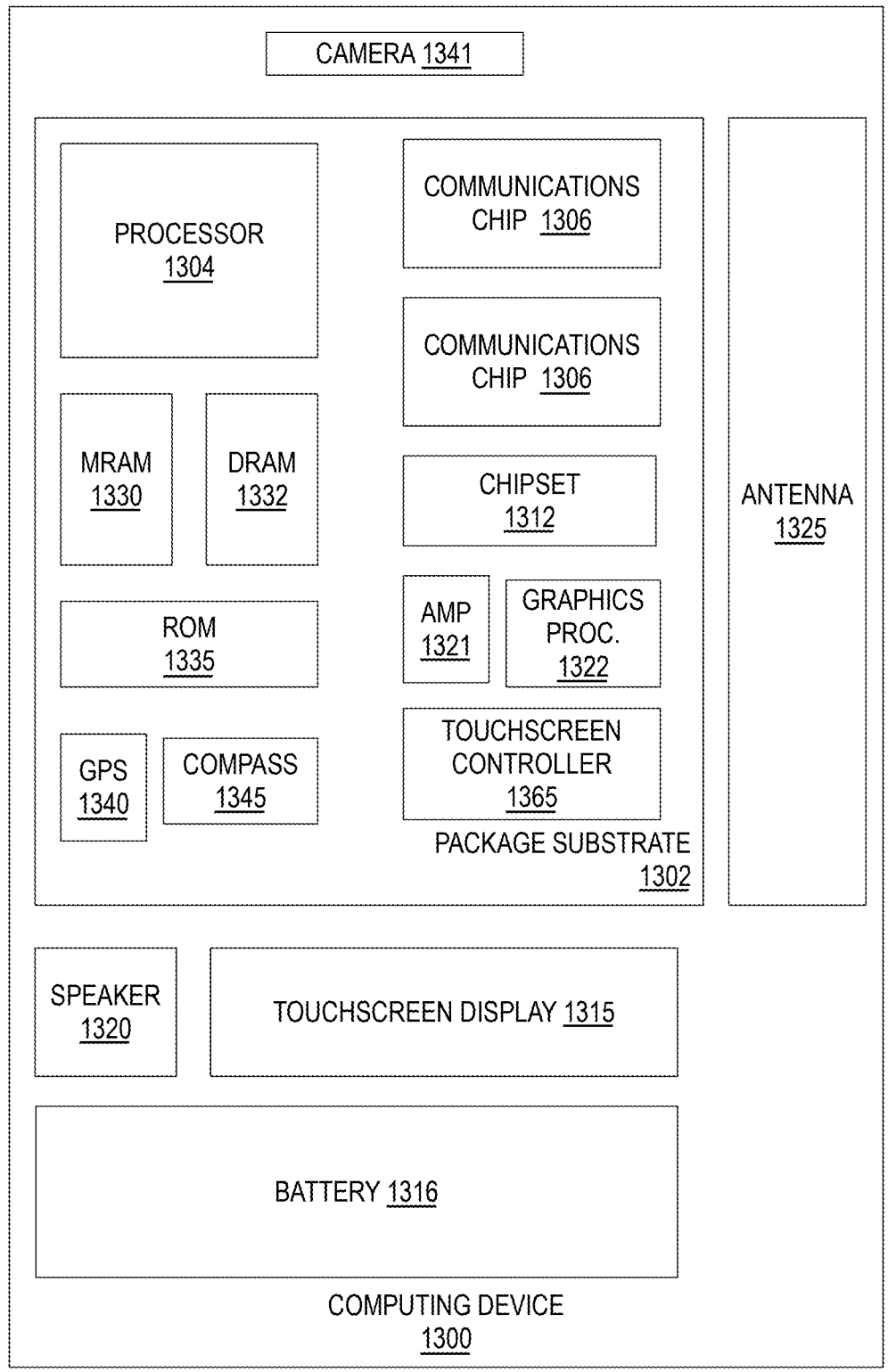
FIG. 13 is a functional block diagram of an electronic computing device, in accordance with some embodiments.

FIG. 13 is a functional block diagram of an electronic computing device 1300, in accordance with an embodiment of the present invention. Computing device 1300 may be found inside platform 1205 or server platform 1206, for example. Device 1300 further includes a host substrate 1302 hosting a number of components, such as, but not limited to, a processor 1304 (e.g., an applications processor). Processor 1304 may be physically and/or electrically coupled to host substrate 1302. In some examples, processor 1304 includes interconnect structures where differential vias contact laterally staggered interconnect lines in which only a top level of the staggered interconnect lines comprises a cap material, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the motherboard 1302. In further implementations, communication chips 1306 may be part of processor 1304. Depending on its applications, computing device 1300 may include other components that may or may not be physically and electrically coupled to host substrate 1302. These other components include, but are not limited to, volatile memory (e.g., DRAM 1332), non-volatile memory (e.g., ROM 1335), flash memory (e.g., NAND or NOR), magnetic memory (MRAM 1330), a graphics processor 1322, a digital signal processor, a crypto processor, a chipset 1312, an antenna 1325, touchscreen display 1315, touchscreen controller 1365, battery 1316, audio codec, video codec, power amplifier 1321, global positioning system (GPS) device 1340, compass 1345, accelerometer, gyroscope, speaker 1320, camera 1341, and mass storage device (such as hard disk drive, solid-state drive (SSD), compact disk (CD), digital versatile disk (DVD), and so forth), or the like. In some exemplary embodiments, at least one of the functional blocks noted above include interconnect structures with differential vias contact laterally staggered interconnect lines in which only a top level of the staggered interconnect lines comprises a cap material, for example as described elsewhere herein.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1306 may implement any of a number of wireless standards or protocols, including but not limited to those described elsewhere herein. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) interconnect structure comprises a plurality of first interconnect lines within a first plane of the structure and having a pitch. The structure comprises a plurality of second interconnect lines within a second plane of the structure, over the first plane. Individual ones of the second interconnect lines comprise a cap material over a fill material, and are laterally staggered from the first interconnect lines by less than the pitch. The interconnect structure comprises a plurality of interconnect vias within a third plane of the structure, over the second plane, wherein a first of the interconnect vias intersects one of the first interconnect lines and wherein a second of the interconnect vias intersects one of the second interconnect lines.

In second examples, for any of the first examples a dielectric material is between individual ones of the second interconnect lines, the first of the interconnect vias passes through the dielectric material, and the cap material comprises a metal.

In third examples, for any of the first through second examples the cap material comprises predominantly Ru, Co, Mo, W, Ni, Pd or Ir.

In fourth examples, for any of the third examples the fill material is predominantly Cu and the cap material comprises predominantly Co, Mo, W, Ni, Pd or Ir.

In fifth examples, for any of the third examples the fill material is predominantly W and the cap material comprises predominantly Ru, Co, Mo, Ni, Pd or Ir.

In sixth examples, for any of the third examples the fill material is predominantly Ru and the cap material comprises predominantly Mo or W.

In seventh examples, for any of the first through sixth examples the second interconnect lines are substantially parallel to the first interconnect lines. The first plane does not pass through the second interconnect lines. The second plane does not pass through the first interconnect lines, and individual ones of the second interconnect lines are laterally staggered from the first interconnect lines by approximately half the pitch.

In eighth examples, for any of the first through seventh examples the cap material is substantially absent from the first interconnect lines.

In ninth examples, for any of the first through eighth examples the second of the interconnect vias is in direct contact with the fill material.

In tenth examples, for any of the first through ninth examples the cap material is between the fill material and the second of the interconnect vias.

In eleventh examples, an integrated circuit (IC) structure comprise a device layer comprising a plurality of transistors comprising a semiconductor material, and an interconnect level over the device layer. The interconnect level further comprises a plurality of first interconnect lines within a first plane of the structure and having a pitch. The interconnect level comprises a plurality of second interconnect lines within a second plane of the structure, over the first plane. Individual ones of the second interconnect lines comprise a cap material over a fill material, and are laterally staggered from the first interconnect lines by less than the pitch. The interconnect level comprises a plurality of interconnect vias within a third plane of the structure, over the second plane. A first of the interconnect vias intersects one of the first interconnect lines, and a second of the interconnect vias intersects one of the second interconnect lines.

In twelfth examples, a computer platform comprises a power supply, and the IC structure of the eleventh examples coupled to the power supply.

In thirteenth examples, a method of fabricating an interconnect structure comprises forming staggered interconnect lines within one or more first dielectric materials. A first plurality of the interconnect lines is within a first plane of the structure and has a pitch. A second plurality of the interconnect lines is within a second plane of the structure, and is laterally staggered from the first plurality by less than the pitch. The method comprises depositing a cap material upon a surface of the second plurality of interconnect lines, depositing a second dielectric material over cap material and over the first dielectric materials, and etching a plurality of vias through the second dielectric material. A first of the vias exposes the cap material, and the method comprises advancing a second of the vias through a least a partial thickness of the first dielectric materials, and depositing conductive material within the first of the vias and the second of the vias.

In fourteenth examples, for any of the thirteenth examples depositing the cap material comprises selectively depositing a metal upon the second plurality of interconnect lines.

In fifteenth examples, for any of the fourteenth examples selectively depositing the metal further comprises depositing predominantly Ru, Co, Mo, W, Ni, Pd or Ir.

In sixteenth examples, for any of the fifteenth examples selectively depositing the metal further comprises inhibiting an exposed surface of the first dielectric materials with a self-assembled monolayer.

In seventeenth examples, for any of the fifteenth through sixteenth examples the second interconnect lines comprise predominantly Cu, and selectively depositing the metal further comprises depositing predominantly Co, Mo, W, Ni, Pd or Ir, or the second interconnect lines comprise predominantly W, and selectively depositing the metal further comprises depositing predominantly Ru, Co, Mo, Ni, Pd or Ir, or the second interconnect lines comprise predominantly Ru, and selectively depositing the metal further comprises depositing predominantly Mo or W.

In eighteenth examples, for any of the thirteenth through seventeenth examples depositing conductive material within the first of the vias and the second of the vias comprises depositing a via metal and planarizing the metal with a surface of the second dielectric material.

In nineteenth examples, for any of the eighteenth examples the via metal within the first of the vias is in direct contact with cap material.

In twentieth examples, for any of the thirteenth through nineteenth examples the method comprises forming a device layer comprising a plurality of transistors comprising a semiconductor material, and the interconnect lines are coupled to the transistors.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) interconnect structure, comprising:
    a plurality of first interconnect lines having their longest lengths extending in a first direction within a first plane of the structure, wherein the first interconnect lines are physically spaced apart from each other and have a pitch in a second, orthogonal, direction;
    a plurality of second interconnect lines having their longest lengths extending in the first direction, physically spaced apart from each other, and having the pitch in the second direction within a second plane of the structure, over the first plane, wherein individual ones of the second interconnect lines comprise a metal cap material over a metal fill material, and are laterally spaced apart from the first interconnect lines by a non-zero distance in the second direction that is less than the pitch; and
    a plurality of interconnect vias within a third plane of the structure, over the second plane, wherein a first of the interconnect vias passes between two adjacent ones of the second interconnect lines and is in contact with one of the first interconnect lines and wherein a second of the interconnect vias is in contact with one of the second interconnect lines.

2. The IC interconnect structure of claim 1, wherein:
a dielectric material is between individual ones of the second interconnect lines;
the first of the interconnect vias passes through the dielectric material;
the metal fill material has a sidewall adjacent to the dielectric material; and
the metal cap material is substantially absent from between the sidewall and the dielectric material.

3. The IC interconnect structure of claim 2, wherein the cap material comprises predominantly Ru, Co, Mo, W, Ni, Pd or Ir.

4. The IC interconnect structure of claim 3, wherein the fill material is predominantly Cu and the cap material comprises predominantly Co, Mo, W, Ni, Pd or Ir.

5. The IC interconnect structure of claim 3, wherein the fill material is predominantly W and the cap material comprises predominantly Ru, Co, Mo, Ni, Pd or Ir.

6. The IC interconnect structure of claim 3, wherein the fill material is predominantly Ru and the cap material comprises predominantly Mo or W.

7. The IC interconnect structure of claim 1, wherein:
the first plane does not pass through the second interconnect lies;
the second plane does not pass through the first interconnect lines; and
the second interconnect lines are separated from the first interconnect lines by a non-zero thickness of one or more intervening dielectric materials.

8. The IC interconnect structure of claim 1, wherein the cap material is substantially absent from the first interconnect lines.

9. The IC interconnect structure of claim 1, wherein the second of the interconnect vias is in direct contact with the fill material.

10. The IC interconnect structure of claim 1, wherein the cap material is between the fill material and the second of the interconnect vias.

11. An integrated circuit (IC) structure, comprising:
a device layer comprising a plurality of transistors comprising a semiconductor material; and
an interconnect level over the device layer, wherein the interconnect level further comprises the IC interconnect structure of claim 1.

12. A computer platform comprising:
a power supply; and
the IC structure of claim 11 coupled to the power supply.

* * * * *